United States Patent
Lim

(10) Patent No.: US 8,237,833 B2
(45) Date of Patent: Aug. 7, 2012

(54) IMAGE SENSOR AND METHOD FOR MANUFACTURING THE SAME

(75) Inventor: Gun Hyuk Lim, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 378 days.

(21) Appl. No.: 12/509,548

(22) Filed: Jul. 27, 2009

(65) Prior Publication Data

US 2010/0026864 A1    Feb. 4, 2010

(30) Foreign Application Priority Data

Jul. 29, 2008  (KR) ........................ 10-2008-0074138

(51) Int. Cl.
*H04N 3/14* (2006.01)
*H01L 21/00* (2006.01)
*H01L 31/062* (2012.01)

(52) U.S. Cl. ........................ 348/294; 438/48; 257/291

(58) Field of Classification Search .................. 348/294, 348/302, 308, 311; 438/48, 83; 257/291, 257/292

See application file for complete search history.

(56) References Cited

U.S. PATENT DOCUMENTS

| 6,730,914 B2 * | 5/2004 | Chao et al. ............... 250/370.14 |
| 6,841,411 B1 * | 1/2005 | Varghese ........................ 438/48 |
| 7,550,813 B2 * | 6/2009 | Suzuki .......................... 257/291 |
| 2004/0041224 A1 * | 3/2004 | Chao et al. ....................... 438/48 |
| 2006/0073628 A1 * | 4/2006 | Uchiya et al. ................... 438/57 |
| 2006/0172450 A1 * | 8/2006 | Tazoe et al. ..................... 438/57 |
| 2009/0166788 A1 * | 7/2009 | Lim ................................ 438/98 |
| 2009/0286347 A1 * | 11/2009 | Kim et al. ....................... 438/72 |

FOREIGN PATENT DOCUMENTS

| KR | 10-2006-0076071 A | 7/2006 |
| KR | 10-2006-0091190 A | 8/2006 |
| KR | 10-2007-0000578 A | 1/2007 |

* cited by examiner

*Primary Examiner* — Nhan T Tran
(74) *Attorney, Agent, or Firm* — Saliwanchik, Lloyd & Eisenschenk

(57) ABSTRACT

Provided are an image sensor and a method for manufacturing the same. The image sensor comprises: a readout circuitry, an interconnection, a contact plug, and an image sensing device. The readout circuitry is formed in a first substrate. The interconnection is electrically connected to the readout circuitry over the first substrate. The contact plug is formed over the interconnection, and includes an insulating layer at regions in an upper side thereof. The image sensing device is formed over the contact plug.

16 Claims, 4 Drawing Sheets

IMAGE SENSOR AND METHOD FOR MANUFACTURING THE SAME

CROSS-REFERENCE TO RELATED APPLICATION

This application claims under 35 U.S.C. §119 of Korean Patent Application No. 10-2008-0074138, filed Jul. 29, 2008, which is hereby incorporated by reference in its entirety.

BACKGROUND

The present disclosure relates to an image sensor and a method for manufacturing the same.

An image sensor is a semiconductor device for converting an optical image into an electric signal. The image sensor may be classified into a charge coupled device (CCD) image sensor and a complementary metal oxide semiconductor (CMOS) image sensor (CIS).

During the fabrication of image sensors, a photodiode may be formed in a substrate using ion implantation. As the size of a photodiode is reduced for the purpose of increasing the number of pixels without increasing chip size, the area of a light receiving portion is also reduced, thereby resulting in a reduction in image quality.

Also, since a stack height does not reduce as much as the reduction in the area of the light receiving portion, the number of photons incident to the light receiving portion is also reduced due to diffraction of light called Airy disk.

As an alternative to overcome this limitation, an attempt of forming a photodiode using amorphous silicon (Si), or forming a readout circuitry in a silicon (Si) substrate using a method such as wafer-to-wafer bonding, and forming a photodiode on and/or over the readout circuitry has been made (referred to as a three-dimensional (3D) image sensor).

In the related-art, the photodiode and the readout circuitry are connected through metal lines in the manufacturing of a 3D image sensor. A tungsten plug (W-plug) is formed over the metal lines prior to bonding the photodiode and the readout circuitry. However, a bonding area with the photodiode is reduced due to a CMP dishing generated in a tungsten CMP process, resulting in degradation of the bonding efficiency. Accordingly, there is a limitation in acquiring an ohmic contact due to a poor contact between the metal line of the readout circuitry and the photodiode.

Also, in the related-art, there is a limitation of weak bonding strength between a contact plug of a lower substrate including a readout circuitry and a metal of a photodiode.

Since both the source and the drain at sides of the transfer transistor in the related art are heavily doped with N-type impurities, a charge sharing phenomenon occurs. When the charge sharing phenomenon occurs, the sensitivity of an output image is reduced and an image error may be generated. Also, because a photo charge does not readily move between the photodiode and the readout circuitry, a dark current is generated and/or saturation and sensitivity is reduced.

BRIEF SUMMARY

An embodiment provides an image sensor that can acquire an ohmic contact between an interconnection and an image sensing device by reducing a contact surface dishing between the image sensing device and a contact plug of the interconnection, and a method for manufacturing the same.

Another embodiment provides an image sensor that can increase a bonding strength between a contact plug of a lower substrate and an image sensing device of an upper substrate, and a method for manufacturing the same.

Embodiments also provide an image sensor where a charge sharing does not occur while increasing a fill factor and a method for manufacturing the same. Embodiments also provide an image sensor that can minimize a dark current source and inhibit saturation reduction and sensitivity degradation by forming a smooth transfer path of a photo charge between a photodiode and a readout circuit, and a method for manufacturing the same.

In one embodiment, an image sensor comprises: a readout circuitry in a first substrate; an interconnection electrically connected to the readout circuitry over the first substrate; a contact plug partially comprising an insulating layer in an upper side thereof over the interconnection; and an image sensing device over the contact plug.

In another embodiment, a method for manufacturing an image sensor comprises: forming a readout circuitry in a first substrate; forming an interconnection connected to the readout circuitry over the first substrate; forming a contact plug partially comprising an insulating layer in an upper part thereof over the interconnection; and forming an image sensing device over the contact plug.

The details of one or more embodiments are set forth in the accompanying drawings and the description below. Other features will be apparent from the description and drawings, and from the claims.

DETAILED DESCRIPTION

Hereinafter, embodiments of an image sensor and a method for manufacturing the same will be described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Figure 1:
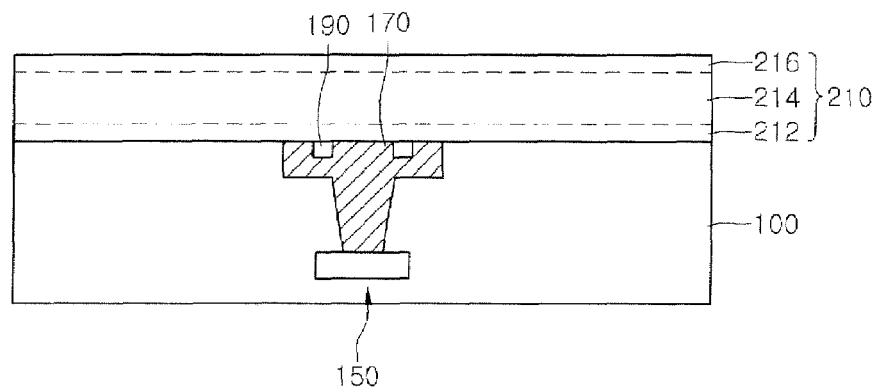
FIG. 1 is a cross-sectional view illustrating an image sensor according to an embodiment.

FIG. 1 is a cross-sectional view illustrating an image sensor according to an embodiment. In the depicted embodiment, a first substrate 100 is provided with an image sensing device 210 thereon. The image sensing device 210 is electrically connected to readout circuitry in the first substrate through an interconnection 150 and a contact plug 170 between the image sensing device 210 and the interconnection 150, where the contact plug 170 partially includes an insulating layer 190 in portions of the upper side of the contact plug 170. FIG. 2B shows a detailed view of a first substrate in accordance with a first embodiment.

According to an embodiment, the image sensor may include a readout circuitry 120 disposed in a first substrate 100; an interconnection 150 disposed over the first substrate 100 to be electrically connected to the readout circuitry 120; a contact plug 170 partially including an insulating layer 190 in an upper side thereof and disposed over the interconnection 150; and an image sensing device 210 disposed over the contact plug 170.

The image sensing device 210 may be a photodiode, but without being limited thereto, may be a photogate, or a combination of the photodiode and the photogate. Embodiments include the image sensing device 210 formed in a crystalline semiconductor layer as an example. However, embodiments are not limited thereto, and may include, for example, a photodiode formed in amorphous semiconductor layer.

Unexplained reference numerals in FIG. 1 will be described with reference to the drawings illustrating a method for manufacturing the image sensor below.

In an image sensor and a method for manufacturing the same according to an embodiment, a contact plug of an interconnection for connection between an image sensing device at an upper part and a readout circuit at a lower part is provided in a damascene form. Here, regions in the surface of the contact plug are etched back and filled with an insulating layer, thereby reducing a dishing phenomenon in a planarization process for the plug. Subsequently, an ohmic contact between the interconnection and the image sensing device can be obtained due to improvement of the bonding efficiency.

In an embodiment, the bonding strength between the contact plug and the image sensing device can be increased by including an insulating layer at portions of the surface of a contact plug of a lower substrate.

In an embodiment, the image sensor may be designed to provide a potential difference between the source and drain of a transfer transistor (Tx), thereby enabling the full dumping of photo charges. In an embodiment, a charge connection region is formed between a photodiode and a readout circuit to create a smooth transfer path of a photo charge, thereby minimizing a dark current source and inhibiting saturation reduction and sensitivity degradation.

Hereinafter, a method for manufacturing the image sensor according to a first embodiment will be described with reference to FIGS. 2 to 8.

Figure 2A:
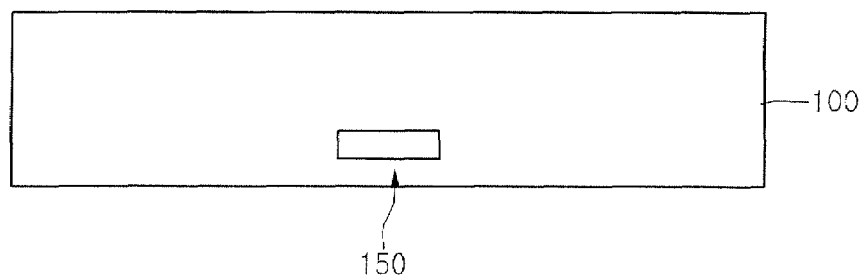
FIGS. 2 to 8 are cross-sectional views illustrating a method for manufacturing the image sensor according to a first embodiment.
Figure 2B:
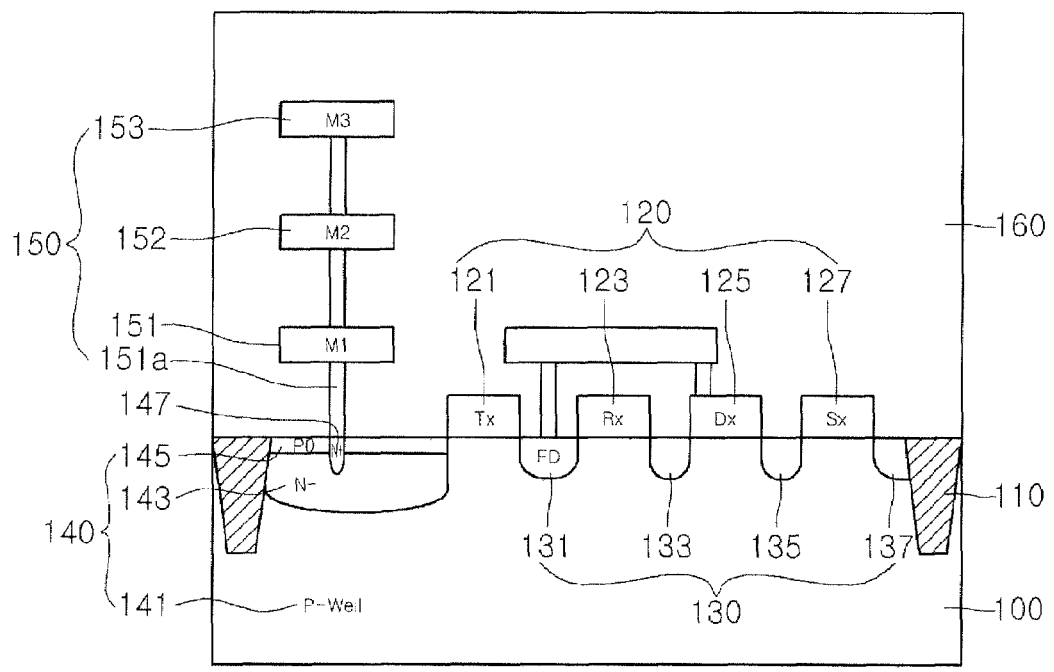

Referring to FIG. 2A, a first substrate 100 can be prepared with an interconnection 150 connected to readout circuitry. As shown in FIG. 2B, according to one embodiment, a first substrate 100 including an interconnection 150 and a readout circuitry 120 is prepared. FIG. 2B is a detail view illustrating the first substrate having the interconnection 150 and the readout circuitry 120. Hereinafter, detailed description will be made with reference to FIG. 2B.

Referring to FIG. 2B, the first substrate 100 where an interconnection 150 and a readout circuitry 120 are formed is prepared. For example, an active region is defined by forming a device separation layer 110 in the first substrate 100. The readout circuitry 120 including a transistor is formed in the active region. For example, the readout circuitry 120 may include a transfer transistor (Tx) 121, a reset transistor (Rx) 123, a drive transistor (Dx) 125, and a select transistor (Sx) 127. A floating diffusion region (FD) 131, and an ion implantation region 130 including source/drain regions 133, 135 and 137 for each transistor may be formed.

The forming of the readout circuitry 120 in the first substrate 100 may include forming an electrical junction region 140 in the first substrate 100 and forming a first conductive connection region 147 connected to the interconnection at the upper part of the electrical junction region 140.

For example, the electrical junction region 140 may be a P-N junction 140, but is not limited thereto. For example, the electrical junction region 140 may include a first conductive type ion implantation 143 formed on a second type conductive well 141 or a second conductive type epitaxial layer, and a second conductive type ion implantation layer 145 formed on the first conductive type ion implantation 143. For example, the P-N junction 140 may be a P0(145)/N−(143)/P−(141) junction, but is not limited thereto. The first substrate 100 may be a second conductive type substrate, but is not limited thereto.

In an embodiment, the image sensor may be designed to provide a potential difference between the source and drain of a transfer transistor (Tx), thereby enabling the full dumping of photo charges. Accordingly, photo charges generated in the photodiode are dumped to the floating diffusion region, thereby increasing the output image sensitivity.

That is, as shown in FIG. 2B, the electrical junction region 140 is formed in the first substrate 100 including the readout circuit 120 to provide a potential difference between the source and drain of the transfer transistor (Tx) 121, thereby enabling the full dumping of photo charges.

Hereinafter, a dumping structure of a photo charge according to an embodiment will be described in detail.

In an embodiment, unlike a floating diffusion (FD) 131 node of an N+ junction, the P/N/P junction 140 of the electrical junction region 140 is pinched off at a predetermined voltage without an applied voltage being fully transferred thereto. This voltage is called a pinning voltage. The pining voltage depends on the P0 (145) and N− (143) doping concentration.

Specifically, electrons generated in the second image sensing device 220 are transferred to the PNP junction 140, and they are transferred to the floating diffusion (FD) 131 node to be converted into a voltage when the transfer transistor (Tx) 121 is turned on.

The maximum voltage of the P0/N−/P− junction 140 becomes a pinning voltage, and the maximum voltage of the FD 131 node becomes $Vdd-V_{th\_Rx}$. Therefore, electrons generated in the second photodiode 210 on the chip may be completely dumped to the FD 131 node without charge sharing, due to a potential difference between the source and drain of the Tx 121.

That is, according to an embodiment, a reason why a P0/N−/P-well junction instead of an N+/P-well junction is formed in a silicon substrate (Si-Sub) of the first substrate 100 is that, in a 4-Tr (four transistor) active pixel sensor (APS) reset operation, a positive (+) voltage is applied to the N− region (143) in the P0/N−/P-well junction and a ground voltage is applied to the P0 region (145) and the P-well (141) and thus a P0/N−/P-well double junction generates a pinch-off at a predetermined voltage or higher like in a BJT structure. This is called a pinning voltage. Thus, a potential difference occurs between the source and drain of the Tx 121, thus making it possible to inhibit a charge sharing phenomenon in a Tx on/off operation.

Thus, unlike the related art case of connecting a photodiode simply to an Nd junction, embodiments of the present invention make it possible to inhibit saturation reduction and sensitivity degradation.

A first conductive connection region 147 can be formed between the photodiode and the readout circuit to create a smooth transfer path of a photo charge, thereby making it possible to minimize a dark current source and inhibit saturation reduction and sensitivity degradation.

To this end, the first embodiment may form a first conductive connection region 147 for an ohmic contact on the surface of the P0/N−/P− junction 140. The N+ region (147) may be formed to penetrate the P0 region (145) to contact the N− region (143).

The width of the first conductive connection 147 may be minimized to inhibit the first conductive connection 147 from being a leakage source. To this end, a plug implant may be performed after etching a contact hole for a first metal contact 151*a*, but embodiments are not limited thereto. For example, an ion implantation pattern (not shown) may be formed by another method, and the ion implantation pattern may be used as an ion implantation mask to form the first conductive connection region 147.

That is, a reason for the local N+ doping of only a contact formation region is to minimize a dark signal and implement the smooth formation of an ohmic contact. If the entire Tx source region is N+ doped like the related art, a dark signal may increase due to an Si surface dangling bond.

Next, an interlayer dielectric 160 may be formed on the first substrate 100, and an interconnection 150 may be formed. The interconnection 150 may include the first metal contact 151*a*, a first metal 151, a second metal 152, and a third metal 153, but embodiments are not limited thereto.

Hereinafter, a process for forming a contact plug 170 including an insulating layer 190 thereon will be described with reference to FIGS. 3 to 7.

Figure 3:
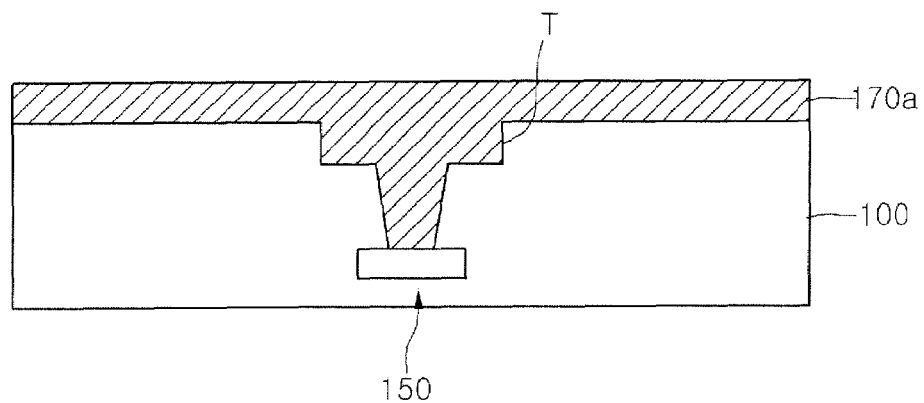

As illustrated in FIG. 3, contact plug metal layer 170*a* is formed on the interconnection 150. For example, a trench T is formed through a damascene process, and a metal layer 170*a* is formed on the first substrate 100 including the trench T. The metal layer 170*a* may be formed of tungsten, but is not limited thereto.

Figure 4:
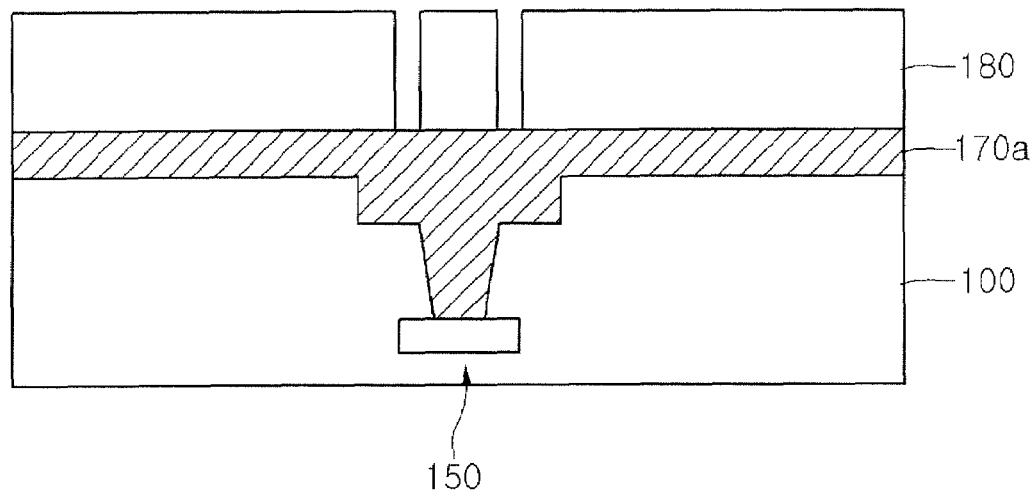

As illustrated in FIG. 4, a photoresist pattern 180 is formed to expose a portion of the surface of the metal layer 170*a*.

Figure 5:
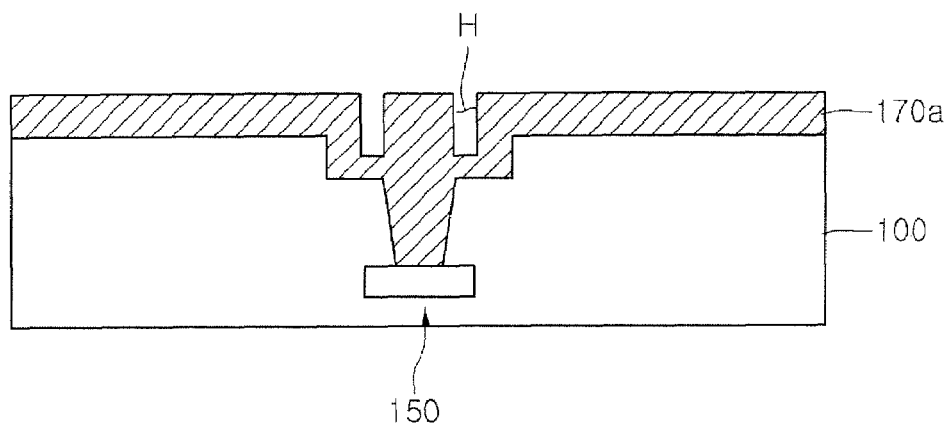

As illustrated in FIG. 5, hole H may be formed in the metal layer 170*a* by etching the exposed metal layer 170*a* using the photoresist pattern 180 as an etching mask. For example, an etch back process may be performed to form the holes H in the metal layer 170*a* using the photoresist pattern 180 as a mask, but methods are not limited thereto.

Figure 6:
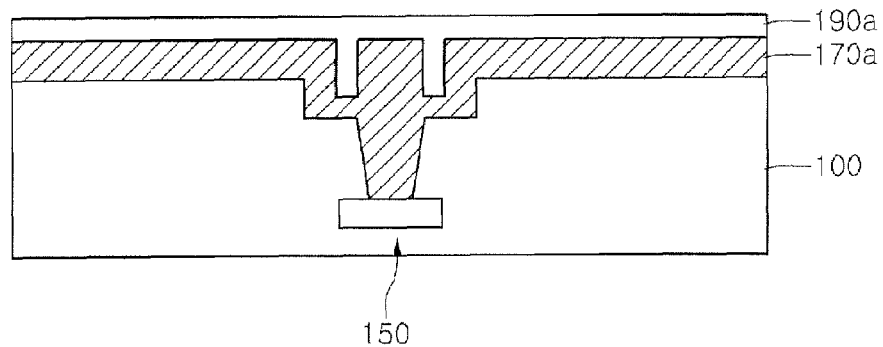

As illustrated in FIG. 6, an insulating material 190*a* may be formed over the first substrate 100 including the hole H. For example, an oxide material 190*a* may be formed over the first substrate 100 including the hole H, but the insulating material is not limited thereto.

Figure 7:
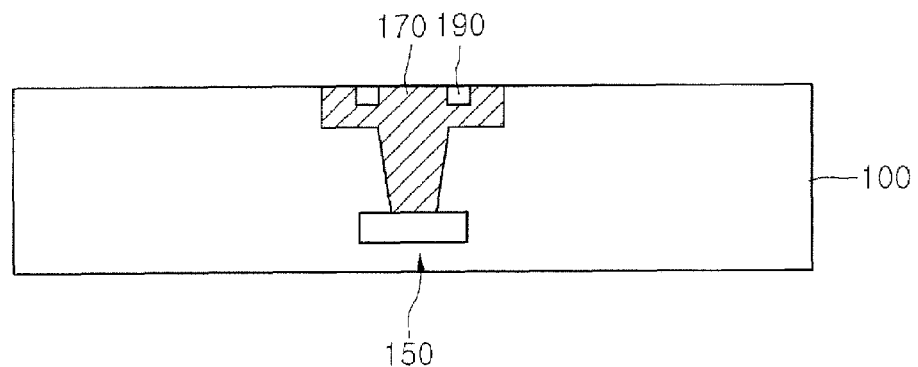

As illustrated in FIG. 7, the insulating material 190*a* and the metal layer 170*a* are sequentially planarized to form a contact plug 170 including an insulating layer 190 in an upper part thereof, but the method steps are not limited thereto. The contact plug 170 having the insulating layer 190 in portions thereof can be exposed at the top surface of the first substrate in preparation for a wafer bonding (e.g., the bonding of the image sensing device).

In an image sensor and a method for manufacturing the same according to an embodiment, a contact plug of an interconnection for connection between an image sensing device at an upper part and a readout circuit at a lower part is provided in a damascene form. Here, regions of the contact surface are etched to reduce a contact surface dishing. Subsequently, an ohmic contact between the interconnection and the image sensing device can be obtained due to improvement of the bonding efficiency.

According to an embodiment, the bonding strength between the contact plug 170 and the image sensing unit 210 thereon can be increased by including an insulating layer 190 in an upper part of the contact plug 170 in a lower substrate. The surface area of the insulating layer 190 may occupy about 5% to about 30% of the total top surface area of the contact plug 170, thereby increasing the bonding strength without a limitation of its conductivity.

Figure 8:
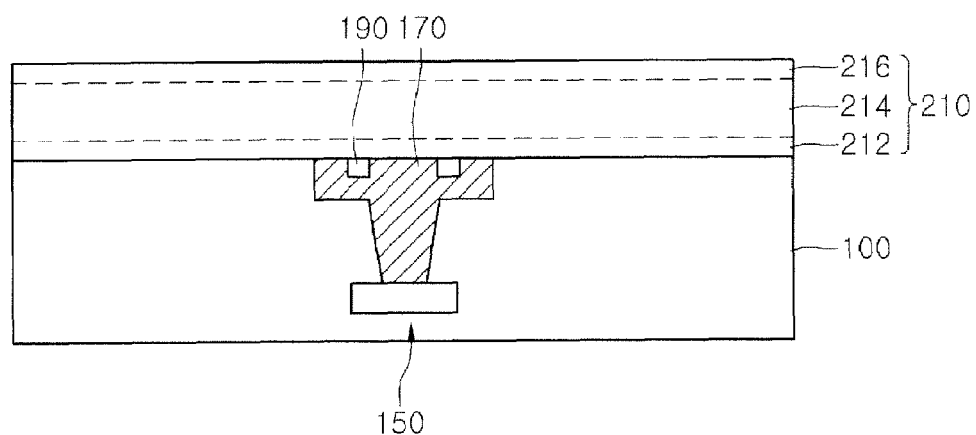

As illustrated in FIG. 8, the image sensing device 210 is formed over the contact plug 170.

For example, a photodiode 210 including a high-concentration P-type conductive layer 216, a low-concentration N-type conductive layer 214, and a high-concentration N-type conductive layer 212 may be formed by implanting ions into a crystalline semiconductor layer of a second substrate (not shown), but embodiments are not limited thereto.

Next, after the second substrate where the image sensing device 210 is formed is bonded to the contact plug 170, the second substrate is removed to leave the image sensing device 210.

Figure 9:
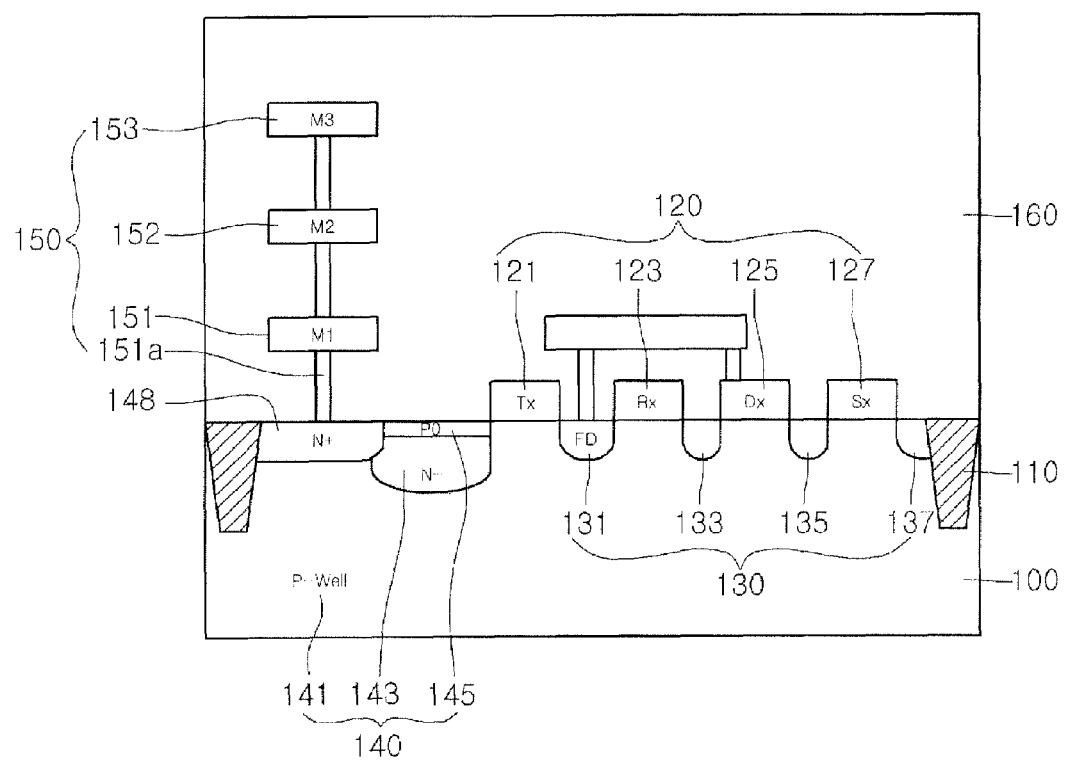
FIG. 9 is a view illustrating an image sensor according to a second embodiment.

FIG. 9 is a cross-sectional view illustrating an image sensor according to a second embodiment, and is a detail view illustrating a first substrate where an interconnection 150 is formed.

The image sensor may include a readout circuitry 120 disposed in a first substrate 100; an interconnection 150 disposed over the first substrate 100 to be electrically connected to the readout circuitry 120; a contact plug 170 including an insulating layer 190 in an upper side thereof and disposed over the interconnection 150; and an image sensing device 210 disposed over the contact plug 170.

The second embodiment may employ the technical features of the first embodiment.

For example, in an image sensor and a method for manufacturing the same according to the second embodiment, a contact plug of an interconnection for connection between an image sensing device at an upper part and a readout circuit at a lower part is provided in a damascene form. Here, a portion of the contact's surface is etched back at regions to reduce a contact surface dishing. Subsequently, an ohmic contact between the interconnection and the image sensing device can be obtained due to improvement of the bonding efficiency.

Also, the bonding strength between the contact plug and the image sensing unit thereon can be increased by including an insulating layer in an upper part of the contact plug on the lower substrate.

Furthermore, the image sensor may be designed to provide a potential difference between the source and drain of a transfer transistor (Tx), thereby enabling the full dumping of photo charges. In an embodiment, a charge connection region is formed between a photodiode and a readout circuit to create a smooth transfer path of a photo charge, thereby minimizing a dark current source and inhibiting saturation reduction and sensitivity degradation.

Unlike the first embodiment, the second embodiment provides a first conductive connection region 148 formed at one side of an electrical junction region 140.

An N+ connection region 148 may be formed at a P0/N−/P− junction 140 for an ohmic contact to the interconnection 150. A process of forming the N+ connection region 148 and a M1C contact 151*a* may provide a leakage source. This is because an electric field (EF) may be generated over the Si surface due to operation while a reverse bias is applied to P0/N−/P− junction 140. A crystal defect generated during the contact forming process inside the electric field may become a leakage source.

Also, when the N+ connection region 148 is formed over the surface of P0/N−/P− junction 140, an electric field may be additionally generated due to N+/P0 junction 148/145. This electric field may also become a leakage source.

Therefore, the second embodiment proposes a layout in which first contact plug 151a is formed in an active region not doped with a P0 layer but including N+ connection region 148 electrically connected to N-junction 143.

According to the second embodiment, the electric field is not generated on and/or over the Si surface, which can contribute to reduction in a dark current of a 3D integrated CIS.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   a readout circuitry in a first substrate;
   an interconnection electrically connected to the readout circuitry over the first substrate;
   a contact plug partially comprising an insulating layer in an upper surface thereof over the interconnection, the insulating layer in the upper surface of the contact plug being an insulating portion within a perimeter of the contact plug such that a metal portion of the contact plug is outside the insulating portion; and
   an image sensing device formed over the contact plug,
   wherein the contact plug comprises a hole on the surface thereof, the hole being filled with the insulating layer.

2. The image sensor according to claim 1, wherein the insulating layer has a surface area occupying about 5% to about 30% of the total top surface area of the contact plug.

3. The image sensor according to claim 1, further comprising an electrical junction region electrically connecting the readout circuitry and the interconnection.

4. The image sensor according to claim 3, wherein the electrical junction region comprises:
   a first conductive type ion implantation region in the first substrate; and
   a second conductive type ion implantation region over the first conductive type ion implantation region.

5. The image sensor according to claim 3, further comprising a first conductive connection region between the electrical junction region and the interconnection.

6. The image sensor according to claim 5, wherein the first conductive connection region is electrically connected to the interconnection at an upper part of the electrical junction region.

7. The image sensor according to claim 5, wherein the first conductive connection region is at one side of the electrical junction region and electrically connects the interconnection to the electrical junction region.

8. The image sensor according to claim 3, wherein the readout circuit has a potential difference between the source and drain of a transistor, the electrical junction region being at the source of the transistor.

9. The image sensor according to claim 8, wherein the transistor is a transfer transistor, and an ion implantation concentration of the source of the transistor is lower than that of a floating diffusion region at the drain of the transistor.

10. A method for manufacturing an image sensor, comprising:
    forming a readout circuitry in a first substrate;
    forming an interconnection connected to the readout circuitry over the first substrate;
    forming a contact plug partially comprising an insulating layer in an upper part thereof over the interconnection; and
    forming an image sensing device over the contact plug;
    wherein the forming of the contact plug comprises:
        forming a metal layer over the interconnection, including in a trench;
        forming a hole in the surface of the metal layer over the trench;
        filling the hole with an insulating layer; and
        forming the contact plug within the trench by planarizing the metal layer, wherein a portion of the insulating layer in the hole remains after planarizing the metal layer.

11. The method according to claim 10, wherein the insulating layer has a surface area occupying about 5% to about 30% of the total top surface area of the contact plug.

12. The method according to claim 10, further comprising forming an electrical junction region in the first substrate and electrically connected to the readout circuitry.

13. The method according to claim 12, further comprising forming a first conductive connection region between the electrical junction region and the interconnection, the first conductive connection region electrically connecting the interconnect to the electrical junction region.

14. The method according to claim 13, wherein the first conductive connection region is electrically connected to the interconnection at an upper part of the electrical junction region.

15. The method according to claim 13, wherein the first conductive connection region is at one side of the electrical junction region.

16. The method according to claim 12, wherein the forming of the electrical junction region comprises:
    forming a first conductive type ion implantation region in the first substrate; and
    forming a second conductive type ion implantation region over the first conductive type ion implantation region.

* * * * *